United States Patent [19]
Guthrie et al.

[11] Patent Number: 5,910,956
[45] Date of Patent: Jun. 8, 1999

[54] RANDOM TIME INTERVAL GENERATOR

[75] Inventors: Warren E. Guthrie, Glen Ellyn; Michael J. Trainor, Palatine, both of Ill.

[73] Assignee: Northrop Gruman Corporation, Los Angeles, Calif.

[21] Appl. No.: 08/743,943

[22] Filed: Nov. 5, 1996

[51] Int. Cl.⁶ .................................................. H04L 2/413
[52] U.S. Cl. ............................. 370/445; 380/46; 364/717
[58] Field of Search .................................... 370/445, 446, 370/447, 448; 380/46; 364/717; 307/139

[56] References Cited

U.S. PATENT DOCUMENTS

| | | | |
|---|---|---|---|
| 3,518,547 | 6/1970 | Filipowsky | 325/42 |
| 3,810,039 | 5/1974 | Fein | 331/78 |
| 3,986,136 | 10/1976 | Hurlburt | 331/78 |
| 4,493,046 | 1/1985 | Watanabe | 364/717 |
| 4,543,657 | 9/1985 | Wilkinson | 375/1 |
| 4,601,047 | 7/1986 | Horwitz et al. | 375/2.2 |
| 4,644,523 | 2/1987 | Horwitz | 370/18 |
| 4,653,076 | 3/1987 | Jerrim et al. | 375/115 |
| 5,084,913 | 1/1992 | Kingston et al. | 375/115 |
| 5,121,408 | 6/1992 | Cai et al. | 375/1 |
| 5,201,000 | 4/1993 | Matyas et al. | 380/46 |
| 5,228,054 | 7/1993 | Reuth et al. | 375/1 |
| 5,245,612 | 9/1993 | Kachi et al. | 370/104.1 |
| 5,258,936 | 11/1993 | Gallup et al. | 364/717 |
| 5,268,899 | 12/1993 | Brown | 370/85.3 |
| 5,383,143 | 1/1995 | Crouch et al. | 364/717 |
| 5,420,928 | 5/1995 | Aiello et al. | 380/46 |
| 5,459,358 | 10/1995 | Rose | 307/139 |
| 5,657,326 | 8/1997 | Burns et al. | 370/445 |

*Primary Examiner*—Chi H. Pham
*Assistant Examiner*—Maikhanh Tran
*Attorney, Agent, or Firm*—Terry J. Anderson; Karl J. Hoch, Jr.

[57] ABSTRACT

A method for generating a random time interval suited for use in defining re-transmission time intervals so as to avoid communication contention utilizes at least one external seed and a plurality of linear maximal sequences. According to one embodiment, a first seed is provided and a first linear maximal sequence is initialized therewith. A second seed is generated via cooperation of the first linear maximal sequence and the external signal. At least one second linear maximal sequence is initialized with the second seed. A new time interval is started when the second linear maximal sequence sequences to a predetermined value.

14 Claims, 3 Drawing Sheets

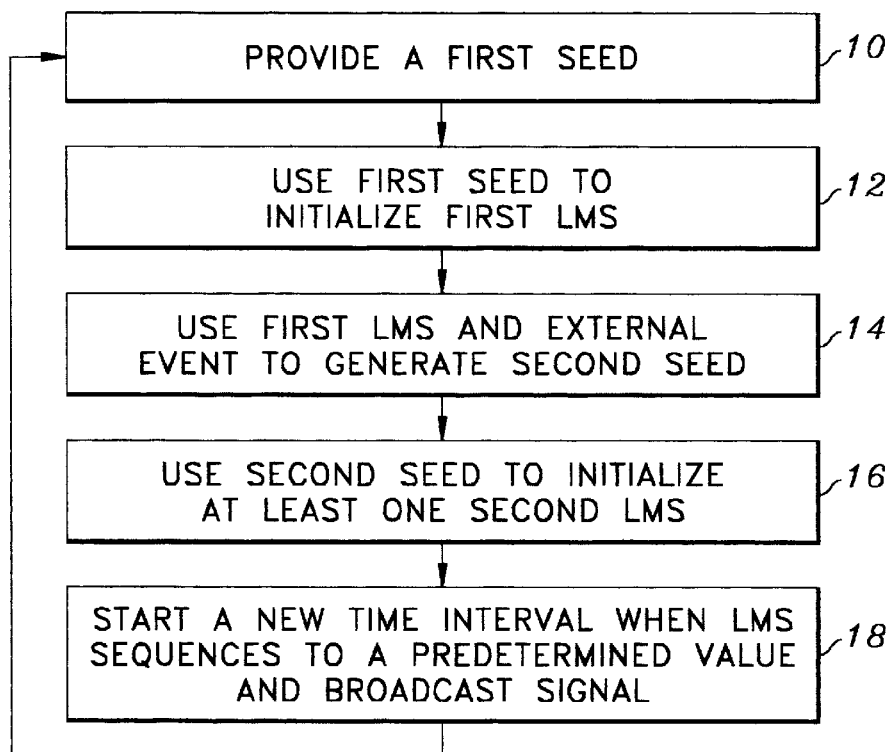
FIG. 1
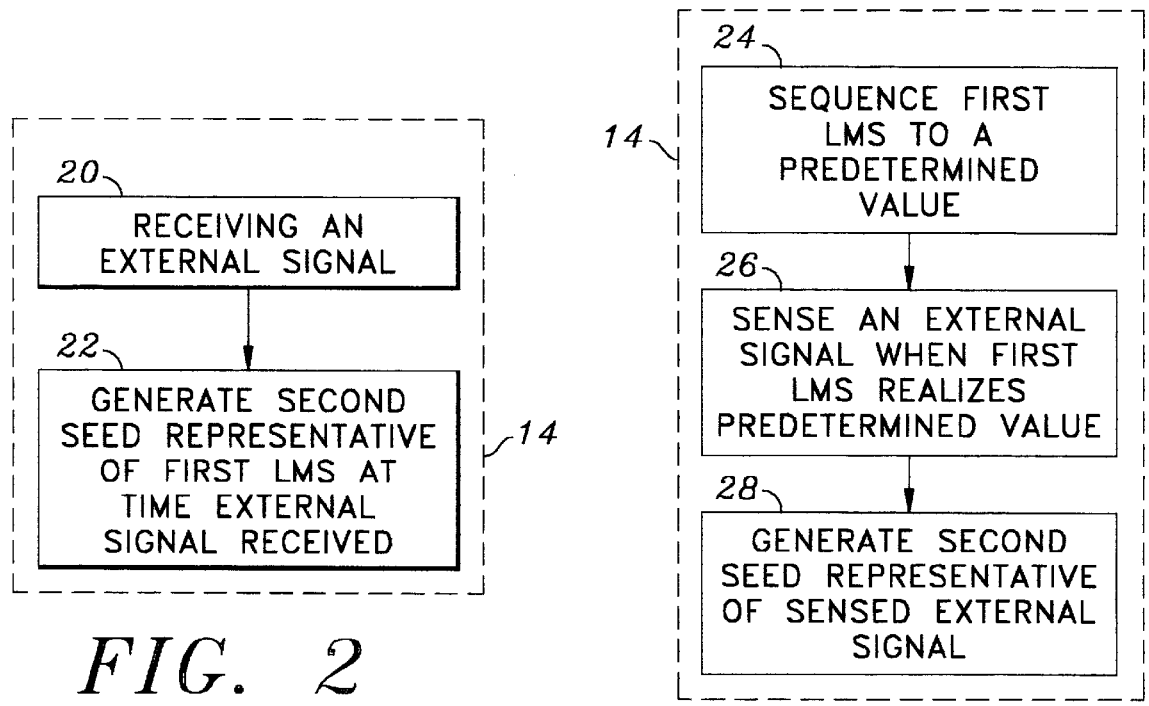
FIG. 2
FIG. 3

RANDOM TIME INTERVAL GENERATOR

FIELD OF THE INVENTION

The present invention relates generally to random number generators and more particularly to a method and apparatus for using an external input and a plurality of linear maximal sequences to generate a random number.

BACKGROUND OF THE INVENTION

Random number generators for use in a variety of different computer algorithms, statistical functions, and computer and communication devices are well known. Moreover, such random number generators find particular application in computerized communications wherein it is desirable that only a single channel of communications be active at a given time. For example, when multiple devices are attached to a computer bus, only one such device may typically be in communications with the microprocessor at a given time. This concept also applies to local area networks, wherein it is generally desirable that only a single client computer be in communications with the host or server at a given instant. Violation of this principle results in bus contention, wherein proper communications between peripheral devices and the microprocessor cease.

Such random number generators actually utilize a pseudorandom number generator which, based upon an initial value or seed, will always return the same sequence of numbers. That is, given a particular seed, two pseudorandom number generators utilizing the same algorithm will always generate the same sequence of numbers. Similarly, a given pseudorandom number generator utilizing the same seed twice in a row will produce the same sequence of numbers both times.

As those skilled in the art will appreciate, such operation is contrary to the notion of a "random" number. In those instances where two separate devices generate a sequence of such pseudorandom numbers utilizing the same seed, the effect may be one totally opposite to that desired. For example, if the pseudorandom numbers are utilized to define re-transmit time intervals, then contention would repeatedly reoccur as the two devices both attempt to transmit simultaneously until the sequence is exhausted.

A more recent application of random number generators is in the definition of a time interval between retransmissions for identification badges to be utilized at facilities having personnel entrance restrictions. In such a system, each person wears a badge which contains a radio frequency transmitter which identifies the person so as to facilitate entrance into a secure area. A receiver at a point of entry controls a lock, so as to selectively facilitate the entrance of personnel.

Communications contention occurs when two or more persons approach the locked door at the same time, such that the receiver receives the radio frequency signals from both transmitters simultaneously.

When this occurs, it is desirable for both transmitter to cease transmitting, wait an interval of time, and then retransmit. Of course, each transmitter must wait a different interval of time, such that contention does not reoccur. In order to accomplish such different retransmission delay times, it is known to utilize a pseudorandom number generator to define the retransmission interval.

However, as discussed above, two pseudorandom number generators utilizing the same algorithm and initialized at the same time with the same seed will provide identical sequences of the transmission intervals. Thus, in this instance, contention would occur during every such retransmission. Although it may indeed be rare that two pseudorandom number generators utilizing the same algorithm are initialized at the same time with the same seed, it is nevertheless undesirable and should be avoided if possible. Further, it should be pointed out that when such pseudorandom number generators are mass produced and/or are utilized in great quantity, then the likelihood of such contention is increased.

In view of the foregoing, it would be desirable to provide a random time interval generator which utilizes an external seed, wherein the external seed would tend to be different for each use, and also which utilizes a different algorithm for the generation of each time interval. In this manner, contention would be rare, and may, indeed, shrink to a vanishingly small probability.

SUMMARY OF THE INVENTION

The present invention specifically addresses and alleviates the above-mentioned deficiencies associated with the prior art. More particularly, on embodiment of the present invention comprises a method for generating a random time interval, which comprises the steps of providing a first seed, initializing a first linear maximal sequence with the first seed, generating a second seed via cooperation of the first linear maximal sequence and an external signal, initializing at least one second linear maximal sequence with the second seed, and starting a new time interval when the second linear maximal sequence sequences to a predetermined value. The steps are repeated, as desired in order to accomplish the required functionality.

The use of maximum length sequences in the generation of a pseudorandom sequence is described in U.S. Pat. No. 4,644,523 issued to Horwitz on Feb. 17, 1987 and in the *Textbook Spread Spectrum Systems* by R. C. Dixon, published by John Wiley and Sons, New York, 1976 (particularly Chapter 9 thereof) both of which are hereby incorporated in their entirety by reference.

According to one preferred embodiment of the present invention, the step of generating a second seed comprises receiving the external signal and generating the second seed such that it is representative of the state of the first linear maximal sequence at a time proximate that of which the external signal was received.

Alternatively, according to another preferred embodiment of the present invention, the step of generating a second seed comprises sequencing the first linear maximal sequence to a predetermined value, sensing an external signal when the first linear maximal sequence reaches the predetermined value, and generating a second sequence which is representative of the sensed external signal.

The step of initializing at least one second linear maximal sequence with the second seed comprises sequentially initializing a plurality of different second linear maximal sequences with the second seed. Each of the second linear maximal sequences defines a random subinterval. Each of the second linear maximal sequences is preferably initialized with a seed defined by the preceding linear maximal sequence and/or a random external event.

The step of initializing a plurality of different second linear maximal sequences comprises initializing a plurality of different second linear maximal sequences selected substantially at random. Selecting a plurality of different linear maximal sequences at random facilitates the use of a different pseudorandom number generating algorithm for each sequence of pseudorandom numbers to be generated, thus further decreasing the likelihood of reoccurring contention.

Thus, according to the present invention, the random time interval generated via cooperation of the linear maximal sequences and at least one external input may be utilized to define the sequence of transmission times for use in a radio frequency identification system. In this manner, repeated communications contention is avoided by assuring that two or more nearby identification transmitters do not transmit repeatedly at the same time. Each separate radio frequency identification transmitter will be subjected to different external inputs, i.e., bumps, from which the seeds are generated, and will consequently utilize different algorithms and different seeds in the generation of the random time intervals therefrom.

BRIEF DESCRIPTION OF THE DRAWING

FIG. 1 is a flow chart showing the methodology for defining random time intervals according to the present invention;

FIG. 2 is a flow chart expanding step 14 of FIG. 1 so as to better define one preferred methodology for using the first LMS and external event to generate a second seed;

FIG. 3 is a flow chart expanding step 14 of FIG. 1 so as to better define another preferred methodology for using the first LMS and external event to generate a second seed;

DETAILED DESCRIPTION OF THE PREFERRED EMBODIMENTS

The detailed description set forth below in connection with the appended drawings is intended as description of the presently preferred embodiments of the invention and is not intended to represent the only forms in which the present invention may be constructed or utilized. The description sets forth the functions and the sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

Figure 4:
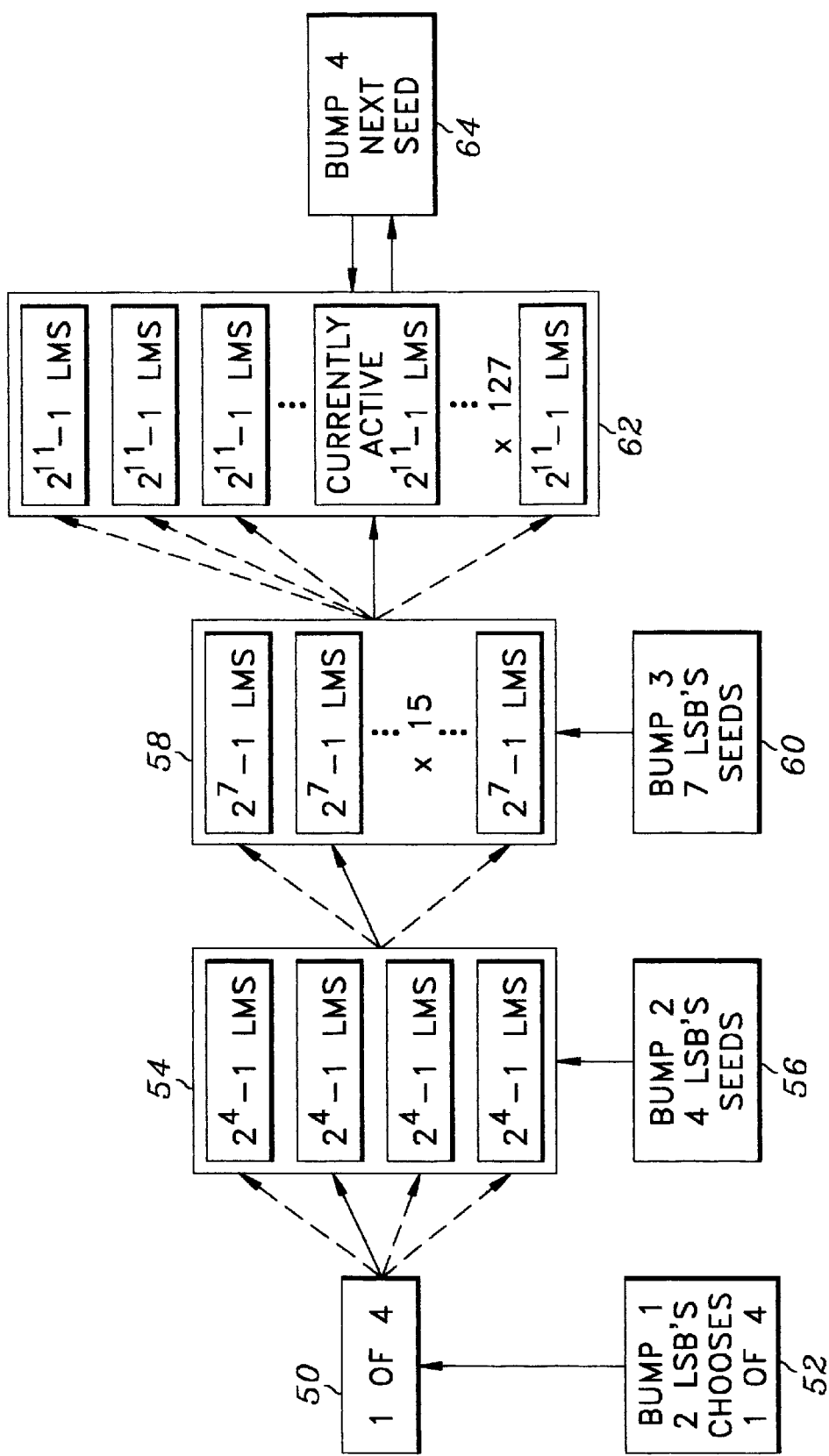
FIG. 4 is a detailed block diagram of another preferred embodiment for generating a random time interval according to the present invention.

The random time interval generator of the present invention as illustrated in FIGS. 1–3 which depict three presently preferred embodiments of the present invention. The first preferred embodiment of the present invention is illustrated in FIGS. 1 and 2, the second preferred embodiment of the present invention is illustrated in FIGS. 1 and 3, and the third preferred embodiment of the present invention is illustrated in FIG. 4.

Referring now to FIG. 1, a flow chart common to both the first and second preferred embodiments of the present invention is provided. As shown in FIG. 1, a first seed is provided 10. According to this embodiment, the origin of the first seed is not crucial. Thus, the first seed may be selected by a user, generated by a pseudorandom number generator, generated from an external input, etc. The first seed is utilized to initiate a first linear maximal sequence (LMS) 12.

Next the first linear maximal sequence (LMS) 12 and an external event are utilized, as discussed in detail below, to generate 14 a second seed. The second seed is then used to initialize 16 at least one second linear maximal sequence (LMS), preferably a plurality of second linear maximal sequences (LMS's). When a plurality of second linear maximal sequences (LMS's) are utilized, then each successive linear maximal sequence (LMS) utilizes a seed defined by the previous linear maximal sequence (LMS).

A new time interval is started 18 when the linear maximal sequence (LMS), or the last linear maximal sequence (LMS) in a series thereof, sequences to a predetermined value, preferably all ones.

When the linear maximal sequence (LMS) sequences to a predetermined value, a random time interval is defined and the radio frequency identification system broadcasts its radio frequency signal.

Referring now to FIG. 2, according to a first preferred embodiment of the present invention, the step of using a first linear maximal sequence (LMS) and external event to generate 14 a second seed comprises receiving 20 an external signal and generating 22 a second seed representative of the state of the first linear maximal sequence (LMS) at the time that the external signal is received. Thus, when a bump, for example, is sensed, then the current state of the first linear maximal sequence (LMS) is utilized to define the second seed. This is preferably accomplished either by capturing the state of the first linear maximal sequence (LMS) at the time a bump is sensed or by transferring the contents of the linear maximal sequence (LMS) to a temporary register.

Referring now to FIG. 3, according to a second preferred embodiment of the present invention, the step of using the first linear maximal sequence (LMS) and external event to generate 14 a second seed comprises the steps of sequencing 24 a first linear maximal sequence (LMS) to a predetermined value, and then sensing 26 an external signal when the first linear maximal sequence (LMS) reaches the predetermined value. A second seed is then generated 28 such that it is representative of the sensed external signal. For example, when the first linear maximal sequence (LMS) sequences to a predetermined value, i.e., all ones, then ambient temperature may be sensed and digitized. The digitized value of ambient temperature is then utilized to generate the seed, such as by taking a desired number of least significant bits thereof.

Referring now to FIG. 4, a third embodiment of the random time interval generator of the present invention is provided. According to the third embodiment of the present invention, the time intervals between four bumps are stored. The two least significant bits of a first bump 52 are utilized to select 50 one of four $2^4$-1 linear maximal sequences (LMS's) 54.

The four least significant bits of a second bump 56 are utilized as seeds for the selected $2^4$-1 linear maximal sequence (LMS's) 54. Similarly, the seven least significant bits of a third bump 60 are utilized as seeds for the $2^7$-1 linear maximal sequences (LMS's) 58.

One of the $2^7$-1 linear maximal sequences (LMS's) 58 is selected by utilizing the current state of the selected $2^4$-1 linear maximal sequence (LMS) 54 at the occurrence of the next bump received while the system is in operation. Similarly, one of the $2^{11}$-1 linear maximal sequences (LMS's) 62 is selected by utilizing the state of the selected $2^7$-1 linear maximal sequence (LMS) 58 when the same bump is received.

The state of the selected $2^{11}$-1 linear maximal sequence (LMS) when a bump is received determines the time interval until the next radio frequency transmission. That value of the selected $2^{11}$-1 linear maximal sequence (LMS) at the time the bump is received also determines the seed of the selected $2^{11}$-1 linear maximal sequence (LMS) for the next cycle of operation.

As those skilled in the art will appreciate, there are four $2^4$-1 long linear maximal sequences (LMS's), all of which are utilized in the third embodiment of the present invention. There are eighteen possible $2^7$-1 long linear maximal sequences (LMS's) 58, of which fifteen are chosen for use in the third embodiment of the present invention. There are one hundred and seventy six possible $2^{11}$-1 long linear maximal sequences (LMS's), of which one hundred and twenty seven are chosen for use in the third embodiment of the present invention. The chosen linear maximal sequences (LMS's) may be selected randomly, since all linear maximal sequence's (LMS's) provide equivalent distributions of sequenced numbers.

According to the present invention, it is assured that no two radio frequency identification tags will become synchronized for an substantial period of time since each different tag receives bumps which result in different seeds and, due to the selection of linear maximal sequences (LMS's) within each tag, different algorithms.

Since there are four different $2^4$-1 long linear maximal sequences (LMS's) to choose from, sixteen different seeds 40 $2^4$-1 long linear maximal sequences (LMS's) one hundred and twenty different seeds for the $2^7$-1 long linear maximal sequences (LMS's), and two thousand forty eight different seeds for the $2^{11}$-1 long linear maximal sequences (LMS's), one of each of these four different parameters which is being selected at any given time, then the odds of synchronizing two different radio frequency identification tags for a single cycle are 1 in 4×16×128×2048=16,777,216.

Since the typical interval for a transmitter is approximately thirty seconds, which might be the average time-out of the $2^{11}$-1 long linear maximal sequence (LMS) interval timer, the time before the sequence repeats is thirty seconds times the length of the remaining linear maximal sequences (LMS's) 30 sec.×127×15=952.5 min. or 16 hours. This is significant since, in the event that two tags have the exact same seeds, they would have to have the same start time for a sixteen hour sequence. For a typical tag transmission of 20 mS, the odds of synchronization are approximately 1 in 2,888,000.

In view of the foregoing, the total probability that two tags are synchronized in both the selected code and timer start time is 1 in 2,888,000×16,777,216, or about 1 in $5 \times 10^{13}$.

Further, since the seeds for the linear maximal sequences (LMS's) can be updated via external inputs, i.e., bumps, ambient temperature, etc., a large number of different pseudorandom number generating algorithms are available for defining the re-transmission time intervals.

Thus, in operation the time intervals between four consecutive bumps are stored in a memory within the radio frequency identification tag. The two least significant bits of one of these bumps is utilized to select one of the four $2^4$-1 linear maximal sequences (LMS's) 54. This may be done, for example, by assigning one of the four $2^4$-1 linear maximal sequences (LMS's) to binary 00, another to binary 01, another to binary 10, and another to binary 11. In this manner, the two least significant bits of the digitized time interval of the selected bump is utilized to select that particular $2^4$-1 linear maximal sequence (LMS) which corresponds thereto.

In this same manner a second stored time interval between bumps 56 is utilized to provide a seed for the selected $2^4$-1 linear maximal sequence (LMS) 54.

With a particular $2^4$-1 linear maximal sequence (LMS) 54 selected and sequencing, the system now waits for another bump to occur. The state of the sequencing selected $2^4$-1 linear maximal sequence (LMS) 54 at the time another bump is sensed then provides a four digit binary number which is utilized to select a $2^7$-1 linear maximal sequence (LMS) 58. Thus, for example, if the state of the selected $2^4$-1 linear maximal sequence (LMS) 54 at the time a bump is received is 0010, then the third $2^7$-1 linear maximal sequence (LMS) 58 (that $2^7$-1 linear maximal sequence (LMS) corresponding to the binary number 0010) is selected and sequencing thereof begins.

When the next bump is sensed, then the state of the selected $2^7$-1 linear maximal sequence (LMS) 58 is similarly utilized to select one of the one hundred and twenty seven $2^{11}$-1 linear maximal sequences (LMS's) 62 and begin sequencing thereof.

When the next bump is sensed, the state of the selected $2^{11}$-1 linear maximal sequence (LMS) 62 then defines the time interval until the next radio frequency transmission is to be made. This is preferably done by loading the value of the selected $2^{11}$-1 linear maximal sequence (LMS) 62 into a countdown register and begin counting thereof. When the countdown register reaches all zeros, then the interval has been defined and it is time to retransmit the radio frequency signal. The value of the selected $2^{11}$-1 linear maximal sequence (LMS) 62 at the time a bump is received is then utilized as a seed to begin sequencing of the next selected $2^{11}$-1 linear maximal sequence (LMS) 62.

It is important to note that all of the linear maximal sequences (LMS's) 54, 58, and 62 sequence simultaneously and that any given bump is utilized to effect all of the above processes simultaneously. That is, a given bump halts sequencing of the selected $2^4$-1 linear maximal sequence (LMS) 54, the selected $2^7$-1 linear maximal sequence (LMS) 58 and the selected $2^{11}$-1 linear maximal sequence (LMS) 62 simultaneously such that the state of the selected $2^4$-1 linear maximal sequence (LMS) 54 is utilized to select a selected $2^7$-1 linear maximal sequence (LMS) 58, the state of the previously selected $2^{11}$-1 linear maximal sequence (LMS) 58 is utilized to select a new $2^{11}$-1 linear maximal sequence (LMS) 62, and the state of the previously selected $2^{11}$-1 linear maximal sequence (LMS) is utilized to both define a new time interval and provide a seed for the newly selected $2^{11}$-1 linear maximal sequence (LMS), all simultaneously.

Figure 5:
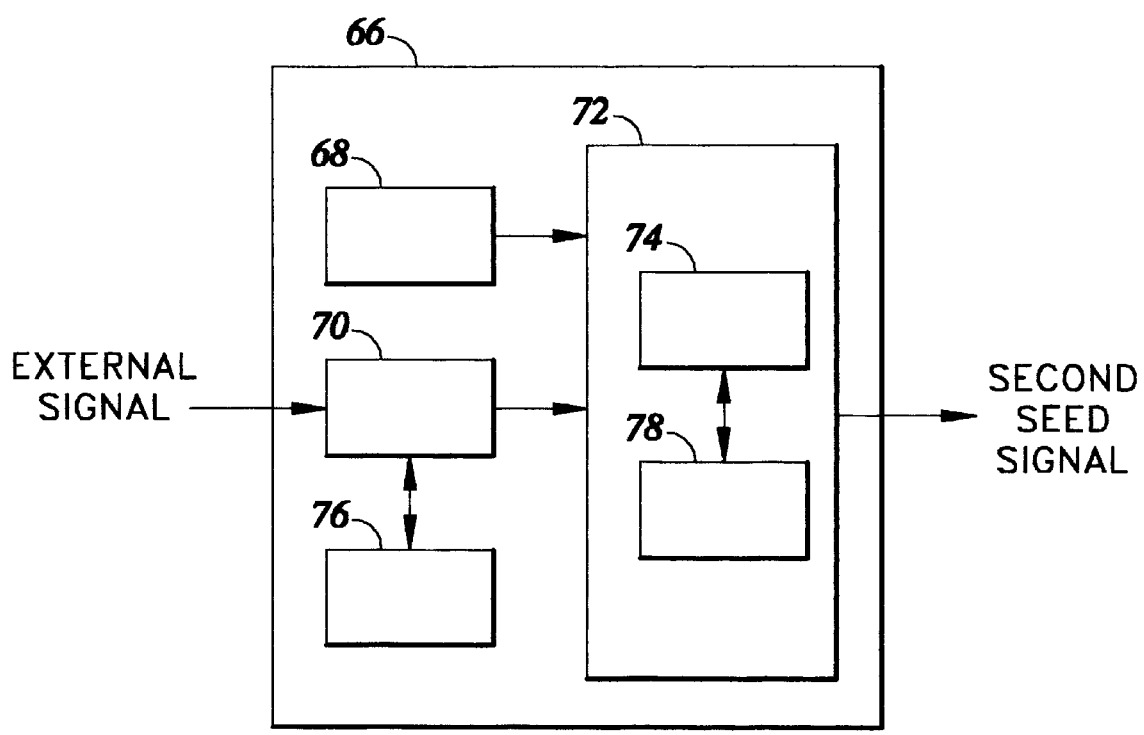
FIG. 5 is a symbolic block diagram of the random interval generator of the present invention.

Referring now to FIG. 5, there is symbolically depicted the random interval generator 66 of the present invention. The random interval generator 66 is provided with a first seed circuit 68 for generating a first seed. The first seed circuit 68 is configured to initialize a first linear maximal sequence and at least one second linear maximal sequence. The random interval generator 66 is further provided with an external signal receiving circuit 70 for receiving an external signal. The random interval generator 66 is further provided with a second seed circuit 72 for generating a second seed via the cooperation of the first linear maximal sequence and the external signal. The second seed circuit 72 is configured to generate the second seed such that it is representative of the state of the first linear maximal sequence at a time proximate that of which the external signal was received. A new time interval commences when the second linear maximal sequence(s) to a predetermined value. At least one second linear maximal sequence may comprise a plurality of different second linear maximal sequences which are initialized with the second seed. In this regard, the random interval generator 66 is further provided with a sequencing circuit 74 for sequencing the first linear maximal sequence to a predetermined value. The random interval generator 66 is further provided with an external signal sensing circuit 76 for sensing an external signal when the first linear maximal sequence reaches the predetermined value, such that the second seed generated is representative of the sensed external signal. The random interval generator 66 is further provided with a random selection circuit 78 for randomly selecting a desired plurality of different second linear maximal sequences at random.

It is understood that the exemplary method for generating a random time interval described herein and shown in the drawings represents only a presently preferred embodiment(s) of the invention. Indeed, various modifications and additions may be made to such embodiment(s) without departing from the spirit and scope of the invention. For example, various different numbers of linear maximal sequences (LMS's), other than the number shown and described, may be utilized. Further, those skilled in the art will appreciate, various different types of external inputs, in addition to those already described, may be utilized. Thus, these and other modifications and additions may be obvious to those skilled in the art and may be implemented to adapt the present invention for use in a variety of different applications.

What is claimed is:

1. A method for generating a random time interval, the method comprising the steps of:
   a) providing a first seed;
   b) initializing a first linear maximal sequence with the first seed;
   c) generating a second seed via cooperation of the first linear maximal sequence and an external signal;
   d) initializing at least one second linear maximal sequence with the second seed;
   e) starting a new time interval when the second linear maximal sequence sequences to a predetermined value; and
   f) repeating steps a–e, as desired.

2. The method as recited in claim 1 wherein the step of generating a second seed comprises:
   a) receiving the external signal; and
   b) generating the second seed such that it is representative of the state of the first linear maximal sequence at a time proximate that of which the external signal was received.

3. The method as recited in claim 1 wherein the step of generating a second seed comprises:
   a) sequencing the first linear maximal sequence to a predetermined value;
   b) sensing an external signal when the first linear maximal sequence reaches the predetermined value; and
   c) generating a second seed which is representative of the sensed external signal.

4. The method as recited in claim 1 wherein the step of initializing at least one second linear maximal sequence with the second seed comprises sequentially initializing a plurality of different second linear maximal sequences with the second seed, each of the second linear maximal sequences defining a random subinterval.

5. The method as recited in claim 4 wherein the step of initializing a plurality of different second linear maximal sequences comprises initializing a plurality of different second linear maximal sequences selected substantially at random.

6. A method for transmitting a signal at random intervals, the method comprising the steps of:
   a) providing a first seed;
   b) initializing a first linear maximal sequence with the first seed;
   c) generating a second seed via cooperation of the first linear maximal sequence and an external signal;
   d) initializing at least one second linear maximal sequence with the second seed;
   e) transmitting the signal when the second linear maximal sequence sequences to a predetermined value; and
   f) repeating steps a–f, as desired.

7. A random interval generator comprising:
   a) a circuit for providing a first seed;
   b) a first linear maximal sequence responsive to the circuit for providing a first seed so as to be initialized thereby;
   c) a circuit for generating a second seed via the cooperation of the first linear maximal sequence and an external signal;
   d) at least one second linear maximal sequence responsive to the circuit for generating a second seed such that the second linear maximal sequence(s) are initialized thereby; and
   e) wherein a new time interval commences when the second linear maximal sequence(s) sequences to a predetermined value provide a random time interval.

8. The random time interval generator as recited in claim 7 wherein the circuit for generating a second seed comprises a circuit for receiving an external signal and a circuit for generating the second seed such that it is representative of the state of the first linear maximal sequence at a time proximate that of which the external signal was received.

9. The random time interval generator as recited in claim 7 wherein the circuit for generating a second seed comprises a circuit for sequencing the first linear maximal sequence to a predetermined value and a circuit for sensing an external signal when the first linear maximal sequence reaches the predetermined value, such that the second seed generated is representative of the sensed external signal.

10. The random time interval generator as recited in claim 7 wherein at least one second linear maximal sequence comprises a plurality of different second linear maximal sequences which are initialized with the second seed.

11. The random time interval generator as recited in claim 7 further comprising a circuit for randomly selecting a desired plurality of different second linear maximal sequences at random.

12. A method for generating a random time interval, the method comprising the steps of:
   a) selecting a plurality of linear maximal sequence(s) according to the steps of:
      i) selecting 127 of a possible 176 $2^{11}$-1 long linear maximal sequence(s);
      ii) selecting 15 of a possible 18 $2^7$-1 long linear maximal sequence(s);
      iii) selecting 4 of a 4 $2^4$-1 long linear maximal sequence(s);
   b) storing four recent bump intervals;
   c) selecting one of the $2^4$-1 long linear maximal sequence(s) utilizing two least significant bits of a first one of the four stored bump intervals;
   d) initializing the selected $2^4$-1 long linear maximal sequence utilizing four least significant bits of a second one of the four stored bump intervals;
   e) selecting one of the $2^7$-1 long linear maximal sequence(s) utilizing the state of the selected $2^4$-1 long linear maximal sequence when a next bump is received;

f) initializing the selected $2^7$-1 long linear maximal sequence utilizing seven least significant bits of a third one of the four stored bump intervals;

g) selecting one of the $2^{11}$-1 long linear maximal sequence (s) utilizing the state of the selected $2^7$-1 long linear maximal sequence when the next bump is received;

h) initialing the selected $2^{11}$-1 long linear maximal sequence with a state of a previously selected $2^{11}$-1 long linear maximal sequence when the next bump is received; and i) sequencing the selected $2^{11}$-1 long linear maximal sequence until another bump is received, the state of the selected $2^{11}$-1 long linear maximal sequence defining the random time interval.

13. A method for generating a random time interval, the method comprising the steps of:

a) providing a first seed;

b) initializing a first linear maximal sequence with the first seed;

c) i) receiving an external signal;

ii) generating a second seed such that it is representative of the state of the first linear maximal sequence at a time proximate that of which the external signal was received;

d) initializing at least one second linear maximal sequence with the second seed;

e) starting a new time interval when the second linear maximal sequence sequences to a predetermined value; and f) repeating steps a–e, as desired.

14. A method for generating a random time interval, the method comprising the steps of:

a) providing a first seed;

b) initializing a first linear maximal sequence with the first seed;

c) i) sequencing the first linear maximal sequence to a predetermined value;

ii) sensing an external signal when the first linear maximal sequence reaches the predetermined value;

iii) generating a second seed which is representative of the sensed external signal;

d) initializing at least one second linear maximal sequence with the second seed;

e) starting a new time interval when the second linear maximal sequence sequences to a predetermined value; and f) repeating steps a–e, as desired.

* * * * *